United States Patent [19]

Aldridge

[11] 4,176,895

[45] Dec. 4, 1979

[54] HIGH DENSITY DOUBLE CONTACTING CONNECTOR ASSEMBLY FOR LEADLESS INTEGRATED CIRCUIT PACKAGES

[75] Inventor: Lionel D. Aldridge, Seminole, Fla.

[73] Assignee: Burroughs Corporation, Detroit, Mich.

[21] Appl. No.: 946,280

[22] Filed: Sep. 27, 1978

[51] Int. Cl.$^2$ .............................................. H05K 1/12
[52] U.S. Cl. ................................ 339/17 CF; 339/174; 339/721 R
[58] Field of Search ....... 339/17 CF, 17 LM, 74 MP, 339/174, 176 MP, 221 R; 361/413, 415; 174/52 FP

[56] References Cited

U.S. PATENT DOCUMENTS

| | | | |
|---|---|---|---|
| 3,771,109 | 11/1973 | Bruckner et al. | 339/174 |
| 3,871,736 | 3/1975 | Carter | 339/221 R |
| 3,873,173 | 3/1975 | Anhalt | 339/17 CF |
| 3,940,786 | 2/1976 | Scheingold et al. | 339/17 CF X |
| 3,951,491 | 4/1976 | Mysiak | 339/17 CF |
| 3,951,495 | 4/1976 | Donaher et al. | 339/17 CF |
| 3,953,101 | 4/1976 | Palecek | 339/17 CF X |
| 3,955,867 | 5/1976 | Braun et al. | 339/17 CF |
| 3,982,159 | 9/1976 | Dennis et al. | 339/17 CF X |
| 3,993,384 | 11/1976 | Dennis et al. | 339/17 CF |
| 3,999,827 | 12/1976 | Hutchison et al. | 339/17 CF |
| 4,008,938 | 2/1977 | Anhalt et al. | 339/17 CF |
| 4,035,046 | 7/1977 | Kloth | 339/17 CF |
| 4,050,755 | 9/1977 | Hasircoglu | 339/17 CF |
| 4,052,118 | 10/1977 | Scheingold et al. | 339/17 CF |

FOREIGN PATENT DOCUMENTS 2312915  12/1976  France .................. 339/17 CF

*Primary Examiner*—E. F. Desmond
*Attorney, Agent, or Firm*—Dale V. Gaudier; Edward J. Feeney, Jr.; Kevin R. Peterson

[57] ABSTRACT

A high density double contacting connector assembly for leadless integrated circuit packages. The plastic connector package includes upper and lower header portions each having a plurality of mating terminal reception channels formed therein. The upper header portion includes probing holes to allow ready testing of integrated circuit packages mounted on the connector assembly. Each channel is designed to receive an S-shaped spring-beam contact. Each type of unitary contact includes an IC terminal contacting portion, a generally S-shaped spring-beam portion, a probe portion, a base portion, and a circuit board contacting portion. Each contact is provided with U-shaped pivot on the base portion for engaging a wall of the terminal reception channels. Preloading means formed in the upper header portions insure that all contacts are automatically preloaded when the upper and lower header portions are secured together.

18 Claims, 9 Drawing Figures

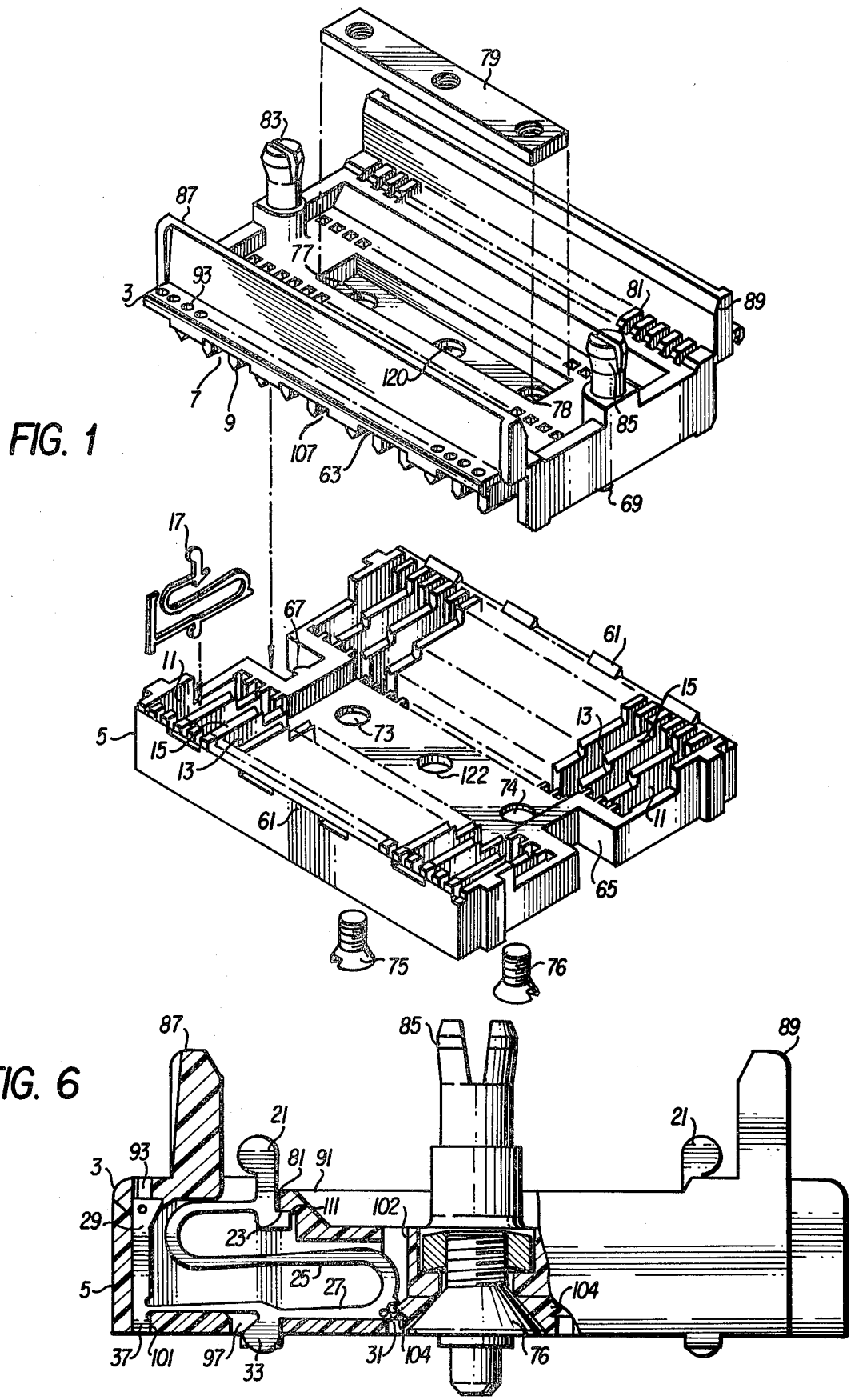

HIGH DENSITY DOUBLE CONTACTING CONNECTOR ASSEMBLY FOR LEADLESS INTEGRATED CIRCUIT PACKAGES

CROSS REFERENCE TO RELATED APPLICATIONS

This invention is related to the following patent application filed simultaneously herewith and assigned to the assignee of this application:

Ser. No. 946,279, by Aldridge, entitled HIGH DENSITY DOUBLE CONTACTING CONNECTOR ASSEMBLY FOR LEADLESS INTEGRATED CIRCUIT PACKAGES, filed Sept. 27, 1978.

BACKGROUND OF THE INVENTION

1. Field of the Invention

The invention relates to connector devices for integrated circuit packages and more particularly to a high density double contacting connector assembly for leadless integrated circuit packages having automatically preloaded contacts and a probing or testing facility.

2. Description of the Prior Art

Connector packages for leadless integrated circuit packages are well known in the art. These packages generally include a one or two piece header unit having two parallel rows of linearly disposed contact terminal cavities formed therein for reception of spring-type metal contacts. Due to the increasing density of large scale integrated circuit devices (LSIs) it is common to encounter such devices having 50 or greater terminal pads disposed thereon. Connection to these pads requires a high degree of accuracy in fabrication and alignment of the various components of a leadless LSI package connector. The circuit package may be connected to a printed circuit board by means of solder tails which project downward to fit through via holes formed on the printed circuit board. However, such schemes have caused considerable problems since the via holes in associated conductor paths on the circuit board must be spaced on 0.050 inch centers. it has been proposed to lessen the contact and conductor tolerances by providing a "double-contacting" connector package. Such a package includes terminal pads on the underside of the connector which rest on narrow conductive areas formed on a printed circuit board, the package being mounted on the circuit board by means of a bolt or screw fastener. Thus, the necessity of forming closely spaced via holes on the board is eliminated. However, such schemes have fallen short in that they have required a considerable amount of the header material to be used to provide dielectric and mechanical isolation between the terminals. Such prior art schemes have failed to provide for adequate and automatic preloading of the terminal itself when the connector package is assembled. Preloading a terminal allows a force to be present upon the instant of contact of the LSI terminal pad with the contacting portion of a connector terminal, thus insuring good electrical conductivity since proper terminal contact-to-IC package pad pressure is available the instant the LSI package is mounted onto the connector package. Furthermore, preloading allows a certain amount of beneficial self-wiping action by the contacting portion of the connector portions.

Prior art spring-type contact terminals have been formed in roughly "C" and "S" shaped configurations of strip-like spring metals of various types. Generally, such contacts have been formed from long pieces of narrow conductive metal strips or wire, such as shown in U.S. Pat. Nos. 3,955,867, 4,052,118, 4,050,755, 3,953,101, 3,933,384, 4,008,938, 3,940,786, 3,982,159, 3,851,491, and 3,873,173. However, such terminals are difficult and expensive to fabricate since the compound curves needed to insure uniform spring pressure from terminal to terminal are difficult to form reproducably and require special metal forming equipment. Additionally, after numerous insertion-removal cycles of an LSI package in a particular connector assembly, these bent strips will tend to weaken along their bends, thus lowering the spring pressure and contact pressure below desirable limits. Additionally, where the lower circuit board contacting portion is also formed of strip-like metallic material, such contacts have tended to be easily damaged or bent during fabrication, requiring much manual labor to straighten them before the connector can be mounted on a printed circuit board. It will be noted that these prior art terminals are usually arranged such that the width of the terminal is aligned horizontally, thus imposing the requirement that each terminal receiving cavity be at least as wide as the width of the terminal. Such prior art arrangements limit the number of terminals which can be placed with a given size of connector package.

It has been proposed to lessen the spacing requirements of the terminals by forming them of stamped sheet metal and mounting them vertically edgewise, as shown in U.S. Pat. No. 3,871,736. Finally, though it has been proposed to include probe holes associated with each terminal to allow testing of a completed connector-LSI package assembly, such as shown in U.S. Pat. No. 3,955,867, such structures have suffered from the disadvantage that contact must be made against a bent strip conductive metallic material which is prone to metal fatique after numerous probing operations. Such prior art probing terminals will tend to permanently "give" or flatten out of reach of the probe tip after a while, resulting in loss of the probing facility at that particular terminal.

SUMMARY OF THE INVENTION

These and other disadvantages of prior art devices are overcome in the present invention wherein there is provided a connector assembly for leadless integrated circuit packages comprising upper and lower molded plastic header portions, each header having a plurality of mating terminal reception channels or cavities formed therein. Each channel accommodates a pair of identical S-shaped spring-beam contacts. Each contact is formed in a unitary piece by die-stamping from conductive sheet material, each contact including an arcuate upper contacting portion, an elongated S-shaped spring-beam portion, a probe portion, a base portion, and an arcuate lower contacting portion. The invention is further characterized in that the S-shaped spring-beam contacts may be formed having a variable cross-sectional area. Each contact is provided with a U-shaped pivot formed as part of the base portion for engaging a wall of the terminal reception channels. A plurality of slot-like openings are provided in the upper header for reception of the arcuate upper contacting portions of each contact which project therethrough to make contact with a leadless IC package. Likewise, a plurality of slot-like openings are provided in the lower header for reception of the arcuate lower contacting portions of each contact, which project therethrough to make contact with conductive areas formed on a printed circuit board. Preloading means are provided in the mating channel portions of the upper header terminal channels adjacent to each slot-like contact opening to cooperate with preloading tabs or projections formed adjacent to the arcuate upper contacting portion of each contact. The upper header further includes probing holes formed adjacent to the probe portions of the contacts to allow ready access thereto.

The lower header portion includes a V-shaped groove formed on the upper portion of the walls separating each lower contact reception cavity and parallel thereto, and the upper header portion includes mating V-shaped projections formed in the upper interior portion of each upper contact reception cavity. The mating V-shaped projections and grooves of the contact cavities interlock with each other during assembly to precisely locate and isolate each pair of contacts, insure good electrical and mechanical isolation, and to control the wiping action of the contacting portions of each contact.

The upper and lower header portions are held together by a pair of flat-head screws and captive nuts or plate. The upper portion of the header is provided with package locating pins to allow ready alignment of the upper and lower header portions during assembly. The upper surface of the upper header portion further includes IC package mounting pins or studs formed thereon.

With the above-described construction the two-piece header assembly can be readily separated in field use to allow ready replacement of damaged contacts. The use of stamped, unitary sheet metal spring-beam contacts of elongated S-shaped and having a controllable variable cross-sectional area allows the spring constant and resultant contact forces to be precisely tailored for a particular application. Further, the use of a die-stamped unitary sheet metal contact allows the upper and lower arcuate contacting portions, the S-shaped spring portion, the probe portion, the base portion, and the pivot portion to be formed in a one step operation. The spring-beam contacts are precisely located in each contact cavity by means of the intermeshing V-shaped grooves and projections formed therein on the lower and upper header portions, thus allowing higher contact densities to be achievable with good electrical and mechanical isolation since the contacts may be mounted with their edges vertically aligned. The U-shaped pivot formed on each contact engages the wall of the contact receiving cavity and acts to locate the contact precisely within the cavity and to support and control the movement of the spring contact when placed under load. Further, the provision of preload tabs formed on the contacts cooperating with preloading means formed on the upper interior portion of each upper header contact cavity allows all the contacts to be automatically preloaded when the upper and lower portions of the headers are assembled.

BRIEF DESCRIPTION OF THE DRAWINGS

These and other objects, features, and advantages of the present invention will be readily apparent from the following description of the preferred embodiment taken in conjunction with the appended claims and the accompanying drawing figures wherein:

FIG. 1 is an exploded perspective view of the various components comprising the connector assembly of the present invention;

FIG. 6 is a right side cross-sectional view of the assembled connector showing the relationship of the various components to each other;

DESCRIPTION OF THE PREFERRED EMBODIMENT

Figure 3:
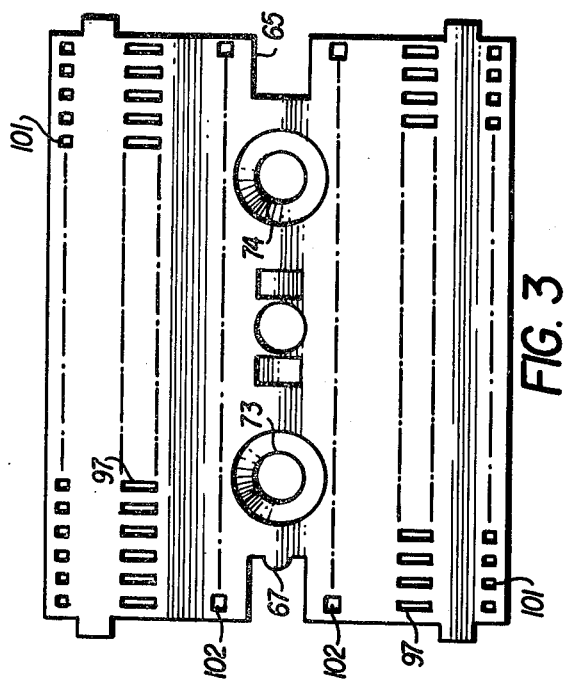
FIG. 3 is a bottom view of the lower header shown in FIG. 2.

Referring to FIG. 1, there is shown an exploded perspective view of the connector assembly 1 of the present invention comprised of a two piece generally rectangular header, upper header 3 and lower header 5. The upper header has two rows of a plurality of upper contact receiving cavities 7, each cavity 7 being separated from its neighbor by a wall 9. Similarly, the lower header portion 5 has two rows of a plurality of lower contact receiving cavities 11, each cavity 11 being separated from its neighbor by a wall 13. It will be noted that the upward portion of each lower cavity wall 13 has a V-shaped groove 15 formed thereon. This V-shaped groove is designed to matingly fit against a V-shaped projection 107 formed in the upper interior portion of the upper header contact receiving cavities 7 (shown more clearly in FIG. 5). It will also be noted that when upper header 3 is fitted over lower header 5 the upper header cavity walls 9 will project down and intermesh with the lower header cavities 11 and the lower header cavity walls 13 will project upwardly and intermesh with the upper header cavity 7 to define two contact receiving areas.

Figure 7:
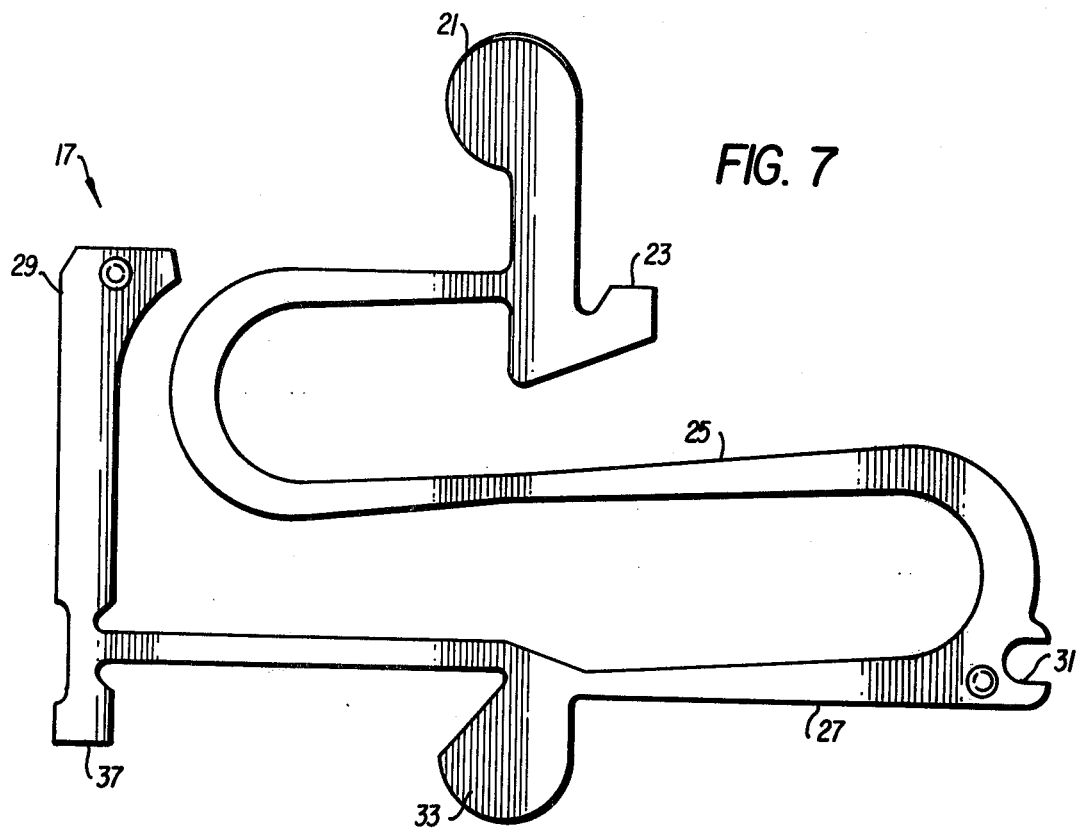
FIG. 7 is a side view of the spring-beam contact shown in FIG. 1.

Each contact receiving cavity is designed to accommodate a pair of spring metal contacts, shown generally as contact 17 in FIG. 1. Contacts 17, shown in more detail in FIGS. 6 and 7, are formed from die-stamped conductive sheet material such as CA 172 manufactured by Olin Brass Company, of approximately 0.012 inch thickness. As shown in FIG. 7, contact 17 comprises an arcuate IC terminal pad contacting portion 21, a preloading tab 23, an elongated S-shaped spring-beam portion 25, a base portion 27, a probe terminal portion 29, a U-shaped pivot portion 31 and an arcuate printed circuit board contacting portion 33. Also shown is location feature 37, formed on the lower part of probe terminal 29.

Contacts 17 preferably are formed having a variable cross-sectional area along their spring-beam portions 25. It has been discovered that by altering the cross-sectional area of the spring-beam, a contact may be formed having a nearly uniform spring pressure and vertically linear travel regardless of the moment force being applied to the contacting portion 21. Ideally, the tapered cross-section may be tailored to the particular needs of the IC package to be contacted, as would be apparent to those skilled in the art. Since the taper is formed as part of the die-stamping process, the spring constant of a particular contact is readily and controllably "built-in" without the need for complex wire or spring bending operations as used in the prior art.

After fabrication, contacts are preferably overcoated with 50 microinches of ductile nickel followed by 100 microinches of gold to the contacting areas 21 and 33, 30 microinches of gold to the probe tip portions 29, and 10 microinches of gold over the rest of the contact. Such overcoating helps to prevent oxide corrosion, as is well known in the art.

Figure 2:
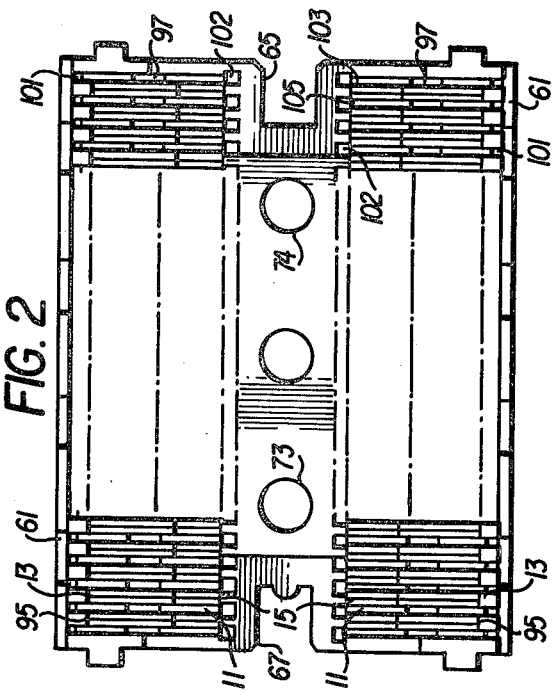
FIG. 2 is a top view showing the interior structure of the contact cavities of the lower header shown in FIG. 1.

Referring again to FIG. 1, it can be seen that lower header 5 further includes a series of V-shaped projections 61 formed along the outer edges of the upper portion of lower header 5 (also shown in FIG. 2). These projections fit into mating recessed portions 63 formed along the outer edges of the lower portion of upper header 3, (also shown in FIG. 5). Projections 61 and recesses 63 interfit when header portions 3 and 5 are pressed together to help hold the two portions together.

Also shown in FIG. 1 are locating and alignment features 65 and 67. Plain opening 65, disposed at one end of the lower header 5, and rounded opening 67, disposed at the opposite end, are designed to receive a mating peg 69 and a slotted projection 71 formed on the underside of upper header 3, as shown clearly in FIG. 5. By this means an operator is prevented from misassembling the header portions 3 and 5. Lower header 5 further includes a pair of openings 73 and 74 for reception of threaded bolts 75 and 76. Threaded bolts 75 and 76 are designed to fit through openings 77 and 78 provided in upper header 3 and openings 73 and 74 in lower header 5. When upper and lower header portions 3 and 5 are assembled together bolts 75 and 76 passing through openings 77, 78 and 73, 74 will be screwed into nut plate 79 to securely hold the assembled upper and lower header portions 3 and 5 together.

Figure 4:
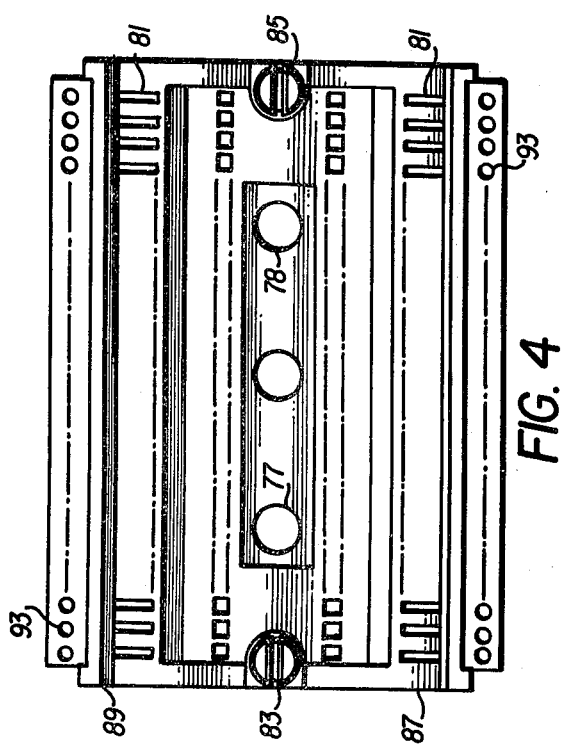
FIG. 4 is a top view of the upper header shown in FIG. 1 showing the probe holes and contact openings structure.

As shown in FIGS. 1 and 4, upper header 3 includes two parallel rows of slot-like openings 81, each slot-like opening communicating with an upper terminal receiving cavity 7. Openings 81 are designed to accommodate the arcuate contacting portions 21 of contacts 17, as shown more clearly in FIG. 6. Preferably, openings 81 are made slightly wider than the thickness of contacting portions 21 of contacts 17 to allow a small amount of side-to-side contact wipe. Also shown in FIG. 1 are split-end mounting studs 83 and 85 formed on the upper surface of upper header 3. Studs 83 and 85 formed on the upper surface of upper header 3. Studs 83 and 85 are designed to matingly fit through mounting holes provided on a leadless IC package such as shown in U.S. Pat. No. 3,955,867. Vertical walls 87 and 89 further define the horizontal IC package receiving area 91. Walls 87 and 89 are parallely disposed adjacent to the two parallel rows of slotted openings 81 and probe holes 93 formed on upper header 3. Walls 87 and 89 act to insure electrical and mechanical isolation of a mounted IC package (not shown) from an electrical probe device such as shown in U.S. Pat. No. 3,955,867 during a probing operation. Probe holes 93 are normally equal in number to the number of slotted openings 81, each probe hole 93 being formed in close proximity to its corresponding slotted opening 81. Probe holes 93 are made of sufficient size to accept a vertical wire-like probe tip as disclosed in U.S. Pat. No. 3,955,867. When upper and lower header portions 3 and 5 are assembled together with their full complement of contacts 17 placed within intermeshed receiving cavities 7 and 11, the probe portions 29 of contacts 17 will project upwardly into the lower portions of their associated probe holes 93 as is shown more clearly in FIG. 6.

Figure 8:
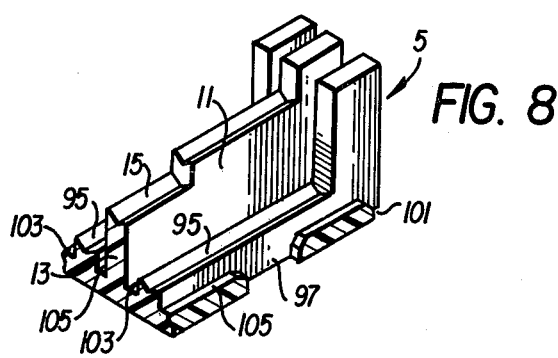
FIG. 8 is a partial broken-perspective view of the interior of the lower header shown in FIG. 1.
Figure 9:
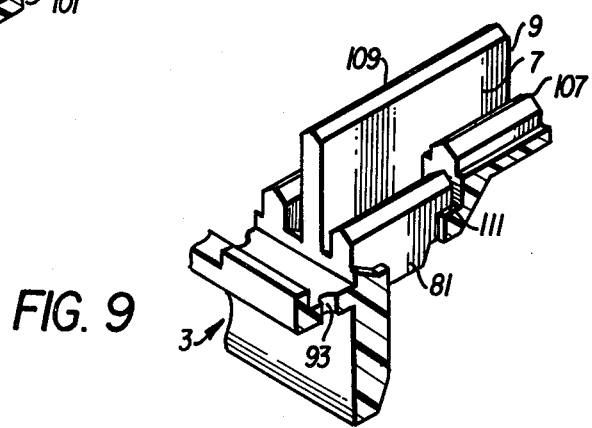
FIG. 9 is a partial broken-perspective view of the interior of the upper header shown in FIG. 1.

Turning now to FIG. 2 there is shown a top view of lower header 5. As can be seen, lower header 5 is generally of rectangular shape having two rows of parallely disposed contact receiving cavities 11 separated by a series of walls 13 each having a V-shaped groove 15 located along the upper portion thereof. As is shown clearly in FIG. 8, each contact receiving cavity 11 includes a grooved area 95 formed in the lower portion of each cavity 11 and parallel to walls 13. Each cavity 11 includes lower contact openings 97 formed in two parallel rows. Openings 97 are designed to accommodate arcuate contacting portions 33 of contacts 17. Preferably openings 97 are made slightly wider than the thickness of contacting portions 33 of contacts 17 to allow a small amount of side-to-side contact wipe. Grooved areas 95 are designed to matingly engage V-shaped projections formed on downwardly projecting walls 9 of upper header 3. When walls 9 intermesh with cavities 11, each cavity is divided in two parts, the first part labeled as 103 accepting one contact 17 and the second part labeled 105 accepting a second contact 17. Walls 13 of cavities 11 separate each such cavity from one another. Further, walls 13 include a two-level V-shaped groove 15 formed along their upper portions which would matingly engage V-shaped projections 107 formed within the upper interior portions of cavity 7 of upper header 3 as shown in FIGS. 1 and 9. Also shown in FIGS. 2, 3, and 8 are the plurality of openings 101, each corresponding with an associated contact accepting area 105 or 103 for retaining their respective contact locating features 37 of contacts 17. Also shown in FIGS. 2 and 6 are openings 102, formed on the interior of each contact receiving area 105 or 103, each having a small projection 104 formed on the inner wall thereof to mate with the U-shaped pivot 31 formed on contacts 17.

Figure 5:
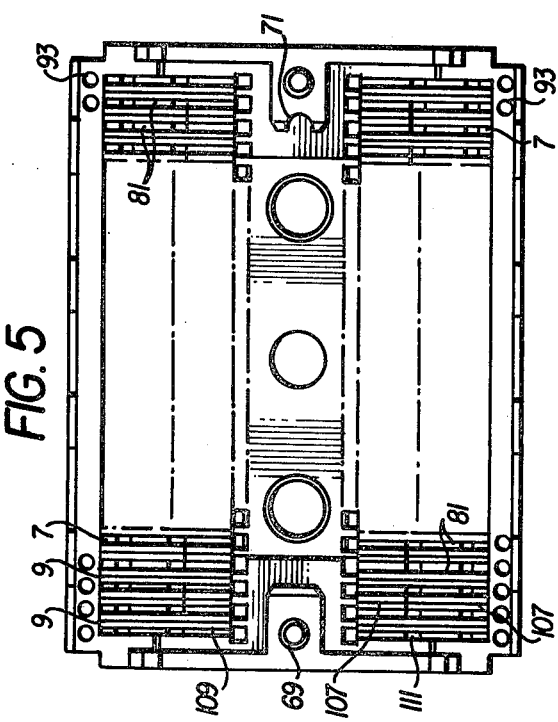
FIG. 5 is a bottom view showing the interior structure of the contact cavities of the upper header shown in FIG. 4.

Turning now to FIGS. 4, 5 and 6 there are shown respectively top, bottom and right side views of the upper header 3 shown in FIG. 1. Upper header 3 is of generally rectangular shape having a pair of parallel facing vertical walls 87 and 89 formed on the upward surface thereof to define an IC package receiving area 91. Also formed on upper header 3 within area 91 are two parallel rows of slot-like openings 81 to receive the arcuate contacting portions 21 of contacts 17. A plurality of openings 93 for receiving the probe portions 29 of terminals 17 are formed in two parallel rows distal to vertical walls 87 and 89, each opening 93 being generally disposed parallel with its associated slot-like opening 81. Also shown in FIGS. 1 and 4 are split-end type mounting studs 83 and 85 formed on the upper surface 91 of header 3. Studs 83 and 85 are of generally cylindrical form each having a V-shaped split-end formed on the upper end thereof. Studs 83 and 85 are designed to fit through mounting holes formed on a leadless IC package so as to securely hold the IC package. Upper header 3 also has a pair of openings 77 and 78 adapted to receive bolts 75 and 76 as described with respect to FIG. 1.

Turning now to the bottom view of upper header 3 as shown in FIG. 5 and the more detailed view provided in FIG. 9, it can be seen that header 3 has a number of parallely disposed contact receiving channels or cavities 7 disposed therein, each cavity separated from its neighbor by a wall 9. Each wall 9 has a generally V-shaped raised area 109 formed on the lower portion thereof, which matingly fits the corresponding V-shaped grooves 95 formed on the lower portions of the contact receiving cavities 11 of lower header portion 5 as shown in FIGS. 2 and 8.

Each cavity 7 of upper header 3 further includes V-shaped projections 107 aligned parallel to walls 9. The V-shaped projections 107 are disposed at two levels as shown in FIG. 9, with a preloading ledge 111 located adjoining the two levels. The V-shaped projections 107 are designed to mate with corresponding V-shaped grooves 15 formed on the upper surface of contact cavity walls 13 of lower header 5. Also shown in FIGS. 5 and 9 are the interior cavity opening portions of slot-like openings 81 and probe holes 93. Also shown in FIG. 5 are alignment stud 69 and slotted projection 71 designed to matingly fit within alignment opening 65 and grooved opening 67 of lower header 5.

Upper and lower header portions 3 and 5 may be formed of various types of materials. In the preferred embodiment, upper and lower header portions 3 and 5 are formed of a thermoplastic material such as Valox 420. Of course, other types of electrically insulative materials could be used.

In assembly, contacts 17 would be placed within their respective contact receiving areas 105 and 103 formed within the lower portion of each contact receiving cavity 11 of the lower header 5. Contacts 17 are placed with their respective lower contacting portions 33 projecting through the slotted openings 97 formed in the base of lower header 5. Grooved area 95 acts to keep the contacts aligned during assembly. The locating features 37 of contacts 17 fit securely into openings 101 formed in the base of lower header 5, as is shown in FIG. 6. The U-shaped pivot portions 31 fit against projections 104 formed with openings 102. When contacts 17 are mounted within lower header 5 with their arcuate contacts 33 projecting through openings 97, their U-shaped pivot portions 31 abutting the ridge 104 within each cavity 11, and their locating features or tabs 37 securely fitted into openings 101, the contacts will be free-standing and precisely located with respect to the upper and lower headers 3 and 5, and to each other. Thus, when upper header 3 is assembled to lower header 5 the arcuate contacting areas 21 of contacts 17 will be precisely spaced and aligned so that they will pass easily through the slot-like openings 81 formed in upper header 3 without jamming. It will be noted that U-shaped pivot portions 31 of contacts 17 cooperate with projections 104 not only to locate one end of the contact 17 precisely within each cavity 11, but also to act as a fulcrum to control the vertical and horizontal motion of the contact while under load. The contact locating and aligning means, which include the U-shaped portions 31 which abut projections 104 formed in openings 102 and locating features 37 which fit securely within openings 101 formed at the opposite end of each contact cavity area 103 and 105, act to secure the contact 17 so that base portion 27 is firmly pressed against and securely held within the lower surface of each cavity 103 and 105. Additionally, the probe portions 29 of contacts 17 will be properly aligned in lower header 5 beneath their associated probe holes 93 formed in upper header 3.

When upper header 3 is assembled to lower header 5 it can be seen that the preloading ledges 11 cooperate with preloading tabs 23 of contacts 17 to cause a slight amount of vertical defection of the contact, as is shown in FIG. 6. The amount of preload can be precisely determined by either adjusting the height of the preload ledge 111 of upper header 3, or by adjusting the height of the contact preloading tabs 23 during the die-stamping operation. It is to be noted that preloading is automatic and simultaneous for all inner and outer contacts disposed within cavities 11 when the upper header 3 is mounted onto the lower header 5.

When upper and lower header portions 3 and 5 are assembled together walls 13 of lower header 5 and walls 9 of upper header 3 intermesh with each other so as to mechanically and electrically isolate each pair of inner and outer contacts. Grooves 15 formed on walls 13 of lower header 5 mate with projections 107 formed within cavities 7 of upper header 3. Grooves 15 and projections 107 serve to both precisely locate the contact cavity areas 103 and 105 and to strengthen the dielectric walls therebetween. As can be seen, V-shaped ridges 109 formed on walls 9 of upper header 3 mate with similarly shaped grooves 95 formed in the lower portion of the contact receiving cavities 11 of lower header 5 to divide the cavities 11 into two contact receiving areas 103 and 105. Because of the contacts 17 may be mounted with their edges vertically disposed, the contacts may be packed more densely than in prior art designs. However, because the invention provides for edge-wise contact with lower contacting portions 33 due to use of vertically, edgewise aligned contacts, printed circuit boards having closer contact pad spacings may be used with the invention with a concomitant increase in available circuit board density.

After the upper header portion 3 is properly mounted onto lower header portion 5 (as is ensured because of mating alignment features 65, 67 and 69, 71) a pair of bolts or screws 75 and 76 are passed through openings 77, 78 and 73, 74 and secured by means of nut plate 79. Of course other types of fastening means could be used and would suggest themselves to those skilled in the art. The use of nut plate 79 and screws 75, 76 allows the user to readily disassemble the connector if desired.

After final assembly of the connector, a leadless IC package, such as shown in U.S. Pat. No. 3,955,867, may be mounted between walls 87 and 89 of upper header 3 so that its contact pads make an electrical connection with the exposed arcuate contacting areas 21 of contacts 17 and 19 projecting through slot-like openings 81. Such IC packages generally are formed with openings for receiving split-post mounting means such as shown in 83 and 85 in FIG. 1. The connector package may be mounted on to a printed circuit board (not shown) having conductive leads and terminal pads formed thereon in a pattern corresponding to the lower contacting terminal configuration of the present invention. The connector package is mounted to the printed circuit board by means of a bolt and nut assembly passing through the openings 120 and 122 formed in upper and lower header portions 3 and 5, respectively, which secures the connector to the board as is well-known in the art. It will be noted that the lower contacting terminals 33 of contacts 17 each project a short distance below the lower surface of lower header 5 which acts to raise the connector package slightly above the printed circuit board surface in order to aid in cleaning fluxes if the board and connector are waved soldered.

Thus it can be seen that the present invention provides for a preloaded leadless integrated circuit package having increased contact density while providing for more relaxed terminal cavity tolerances. The connector assembly further includes a probing facility for each contact and means for ensuring electrical and mechanical isolation between contacts. The unique self-wiping contacts are formed in a single die-stamping operation, preferably with a variable cross-section spring beam, resulting in more linear and precisely controllable forces in the contacts and more uniform forces after numerous insertion-removal cycles. The contacts have means for ensuring exact alignment during assembly, thus eliminating jamming or breakage of the contacts. The contacts are automatically preloaded during assembly of the two-part header.

While the connector assembly of the present invention has been described in considerable detail, it is understood that various changes and modifications may occur to persons of ordinary skill in the art without departing from the spirit and scope of the invention as is defined in the appended claims.

What is claimed is:

1. A connector assembly for leadless integrated circuit packages comprising:
    (a) a plurality of unitary metallic contacts, each of said contacts comprising:
        (i) an elongated S-shaped spring-beam portion;
        (ii) a first contacting portion formed on an upper part of said spring-beam portion;
        (iii) a preloading tab formed on said upper part of said spring-beam adjacent said first contacting area;
        (iv) a substantially flat base portion connected to a lower part of said spring-beam portion; and
        (v) a second contacting portion formed on a lower part of said base portion; and
    (b) upper and lower dielectric headers each having a plurality of contact receiving cavities formed therein, said cavities separated by a plurality of intermeshing walls, each said cavity of said lower header including channel means for receiving said contact, and each said cavity of said upper header including contact receiving means and preloading means to bias said contact in a preloaded position when said upper header is fitted over said lower header.

2. The connector assembly of claim 1 wherein said upper header contact receiving means and preloading means includes an opening for receiving said first contacting portion of said contact and a preloading ledge formed adjacent to said first contact receiving opening to cooperate with said preloading tab formed on said spring-beam portion of said contact to controllably bias said spring-beam portion in a preloaded position when said upper header is fitted over said lower header.

3. The connector assembly of claim 1 wherein said spring-beam portion of said contact is formed having a variable cross-section.

4. The connector assembly of claim 1 wherein said first and second contacting portions of said spring-beam contact are formed having an arcuate shape, said first contacting portion for contacting terminal pads of a leadless integrated circuit device and said second contacting portion for contacting electrical conductors disposed on a printed circuit board.

5. The connector assembly of claim 1 wherein said contact includes a probe portion formed on said base portion and projecting upwardly therefrom.

6. The connector assembly of claim 5 wherein said upper header contact receiving cavities each include an opening formed in an upper portion of said upper header cavity for receiving said probe portion of said contact.

7. The connector assembly of claim 1 wherein said lower header channel means comprises a pair of substantially flat channel portions formed within said lower header contact receiving cavity, each said channel portion including an opening for receiving said second contacting portion of said contact.

8. A connector assembly for leadless integrated circuit packages comprising:
    (a) a plurality of unitary metallic contacts, each of said contacts comprising:
        (i) an elongated S-shaped spring-beam portion;
        (ii) a first arcuate contacting portion formed on an upper part of said spring-beam;
        (iii) a preloading tab formed on said upper part of said spring-beam adjacent said first arcuate contacting area;
        (iv) a substantially flat base portion connected to a lower part of said spring-beam portion;
        (v) a second arcuate contacting portion formed on a lower part of said base portion;
        (vi) a probe portion formed on said base portion; and
        (vii) locating and alignment means formed on said base portion; and
    (b) upper and lower dielectric headers each having a plurality of contact receiving cavities formed therein, said cavities separated by a plurality of intermeshing walls, each said cavity of said lower header including channel means for receiving said contact and locating and alignment means formed within said channnel means for cooperating with said contact locating and alignment means to secureably retain a contact inserted into said channel, and each said cavity of said upper header including contact receiving means and preloading means to bias said contact in a preloaded portion when said upper header is fitted over said lower header.

9. The connector assembly of claim 8 wherein said upper header contact receiving means and preloading means includes a slot-like opening formed in said upper header cavity for receiving said first arcuate contacting portion of said contact, an opening formed in an upper portion of said upper header cavity for receiving said probe portion of said contact and a preloading ledge formed adjacent to said opening to cooperate with said preloading tab formed on said spring-beam portion of said contact to controllably bias said spring-beam portion in a preloaded position when said upper header is fitted over said lower header.

10. The connector assembly of claim 8 wherein said lower header channel means comprises:
    a pair of substantially flat channel portions formed within
        said lower header contact receiving cavity, each
        said channel receiving said base portion of one of
        said plurality of contacts;
    a dielectric wall formed between each pair of channel portions; and
    a slot-like opening for receiving said second arcuate contacting portion of said contact.

11. The connector assembly of claim 8 wherein said locating and alignment means formed on said contact comprises a downwardly projecting locating pin formed on said base portion of said contact and a U- shaped pivot area formed on said contact at the juncture of said base and said spring-beam portions.

12. The connector assembly of claim 11 wherein said locating and alignment means formed within said lower header contact receiving channel means comprises an opening formed in a lower portion of said channel means for receiving said downwardly projecting locating pin of said contact and a ridge formed on a portion of said channel means opposite said locating pin opening for receiving said U-shaped pivot of said contact.

13. The connector assembly of claim 8 wherein said spring-beam portion of said contact is formed having a variable cross-section.

14. A connector assembly for leadless integrated circuit packages comprising:
 (a) a plurality of unitary metallic contacts, each of said contacts comprising:
  (i) an elongated S-shaped spring-beam portion;
  (ii) a first arcuate contacting portion formed on an upper part of said spring-beam;
  (iii) a preloading tab formed on said upper part of said spring-beam adjacent said first arcuate contacting area;
  (iv) a substantially flat base portion connected to a lower part of said spring-beam portion;
  (v) a second arcuate contacting portion formed on a lower part of said base portion;
  (vi) a probe portion formed on said base portion;
  (vii) a locating pin formed on said base portion and
  (viii) a U-shaped pivot area formed on said contact at the juncture of said base and said spring-beam portions; and
 (b) upper and lower dielectric headers each having a plurality of parallely disposed contact receiving cavities formed therein, said cavities separated by a plurality of intermeshing walls, each said cavity of said lower header including:
  a pair of substantially flat channels formed within said lower header contact receiving cavity, each said channel receiving said base of one of said plurality of contacts;
  an opening formed in a lower portion of each of said channels for receiving said contact locating pin;
  a ridge formed in a portion of each said channel opposite said locating pin opening for receiving said U-shaped pivot of said contact; and
  a slot-like opening formed in each said channel for receiving said second arcuate contacting portion of said contact; and
 each said cavity of said upper header including: a slot-like opening formed in an upper portion of said upper header cavity for receiving said first arcuate contacting portion of said contact;
  an opening formed in an upper portion of said upper header cavity for receiving said probe portion of said contact; and
  a preloading ledge formed adjacent to said first contact receiving opening to cooperate with said preloading tab formed on said spring-beam portion of said contact to controllably bias said spring-beam portion in a preloaded position when said upper header is fitted over said lower header.

15. The connector assembly of claim 14 wherein said spring-beam portion of said contact is formed having a variable cross-section.

16. The connector assembly of claim 14 including means for mounting a leadless IC package on said connector assembly.

17. The connector assembly of claim 14 including means for mounting said connector assembly to a printed circuit board.

18. The connector assembly of claim 14 wherein said contacts are vertically, edgewise aligned within their respective contact receiving cavities.

* * * * *